United States Patent
Lee et al.

(10) Patent No.: US 7,643,981 B2
(45) Date of Patent: Jan. 5, 2010

(54) PULSE WAVEFORM TIMING IN EINSTLT TEMPLATES

(75) Inventors: Sang Y. Lee, Austin, TX (US); Vasant B. Rao, Fishkill, NY (US); Jeffrey Soreff, Poughkeepsie, NY (US); James Warnock, Somers, NY (US); David Winston, Rockville, MD (US)

(73) Assignee: International Business Machines Corporation, Armonk, NY (US)

( * ) Notice: Subject to any disclaimer, the term of this patent is extended or adjusted under 35 U.S.C. 154(b) by 1139 days.

(21) Appl. No.: 10/897,347

(22) Filed: Jul. 22, 2004

(65) Prior Publication Data
US 2006/0020443 A1 Jan. 26, 2006

(51) Int. Cl.
*G06F 17/50* (2006.01)
(52) U.S. Cl. .............. 703/15; 703/13; 703/14; 703/16; 716/4; 716/6; 327/31; 327/37; 702/79
(58) Field of Classification Search .......... 703/14, 703/15, 16, 13; 716/4, 6; 702/79; 714/700, 714/709; 327/31, 37
See application file for complete search history.

(56) References Cited

U.S. PATENT DOCUMENTS

| | | | | |
|---|---|---|---|---|
| 4,808,840 A | * | 2/1989 | Chung et al. | 327/206 |
| 5,826,061 A | | 10/1998 | Walp | |
| 6,067,652 A | * | 5/2000 | Fusco et al. | 714/741 |
| 6,408,265 B1 | * | 6/2002 | Schultz et al. | 703/22 |
| 6,567,773 B1 | * | 5/2003 | Rahmat et al. | 703/14 |

OTHER PUBLICATIONS

Wagner, Kenneth D., "Clock System Design", IEEE Design and Test of Computers, IEEE Computers Society, Los Alamitos, US, vol. 5, No. 5, Oct. 1, 1988, pp. 9-27.
Welch et al., "Delay Testing and Failure Analysis of ECL Logic with Embedded Memories", IEEE VLSI Test Symposium, Apr. 15, 1991, pp. 254-259.
Macii et al., "Timing Verification of NMOS Logic Circuits", IEEE Pacific Rim Conference on Victoria, BC, Canada, vol. 2, May 19, 1993, pp. 518-520.

* cited by examiner

*Primary Examiner*—Jason S Proctor
(74) *Attorney, Agent, or Firm*—Stephen R. Tkacs; Stephen J. Walder, Jr.; Matthew B. Talpis

(57) ABSTRACT

The present invention provides for simulating signal transitions. Circuit characteristics are generated. Circuit characteristics are loaded into memory. Circuit behaviour is simulated. A non-leading edge circuit transition is captured. This occurs in software.

18 Claims, 4 Drawing Sheets

PULSE WAVEFORM TIMING IN EINSTLT TEMPLATES

TECHNICAL FIELD

The present invention relates generally to circuit simulation and, more particularly, to simulation of non-leading edge transitions.

BACKGROUND

In evaluating a design constructed with a given process technology, it is needed to be known gate delay for a particular circuit. A ring oscillator can be used to generate measurements of gate delays. In the ring oscillator, a series of gates are coupled front to back, and it is measured how many oscillations the ring has in a given time period, and then divides by the number of gates. This information is then fed into a software simulator/emulator.

In certain circuit simulation techniques used to calculate delays for static timing analysis, the time it takes for the crest of a first pulse to migrate its way through a gate is calculated. However, there is a problem with this approach. There can be a problem when transition times of a pulse after the first pulse are not captured, such as because clocking periods of insufficient duration are not noticed. This can lead to an inability of the conventional software technologies to detect some of the types of timing failures that can occur in certain types of circuit, particularly clock pulse forming circuits.

Therefore, there is a need for a way to measure propagation delay that addresses at least some of the problems associated with conventional measurements of propagation delay.

SUMMARY OF THE INVENTION

The present invention provides for simulating signal transitions. Circuit characteristics are generated. Circuit characteristics are loaded into memory. Circuit behaviour is simulated. A non-leading edge circuit transition is captured.

BRIEF DESCRIPTION OF THE DRAWINGS

For a more complete understanding of the present invention, and the advantages thereof, reference is now made to the following Detailed Description taken in conjunction with the accompanying drawings, in which.

DETAILED DESCRIPTION

In the following discussion, numerous specific details are set forth to provide a thorough understanding of the present invention. However, those skilled in the art will appreciate that the present invention may be practiced without such specific details. In other instances, well-known elements have been illustrated in schematic or block diagram form in order not to obscure the present invention in unnecessary detail.

Additionally, for the most part, details concerning network communications, electro-magnetic signaling techniques, and the like, have been omitted inasmuch as such details are not considered necessary to obtain a complete understanding of the present invention, and are considered to be within the understanding of persons of ordinary skill in the relevant art.

In the remainder of this description, a processing unit (PU) may be a sole processor of computations in a device. In such a situation, the PU is typically referred to as a CPU (central processing unit). The processing unit may also be one of many processing units that share the computational load according to some methodology or algorithm developed for a given computational device. For the remainder of this description, all references to processors shall use the term CPU whether the CPU is the sole computational element in the device or whether the CPU is sharing the computational element with other CPUs, unless otherwise indicated.

It is further noted that, unless indicated otherwise, all functions described herein may be performed in either hardware or software, or some combination thereof. In a preferred embodiment, however, the functions are performed by a processor, such as a computer or an electronic data processor, in accordance with code, such as computer program code, software, and/or integrated circuits that are coded to perform such functions, unless indicated otherwise.

Figure 1:
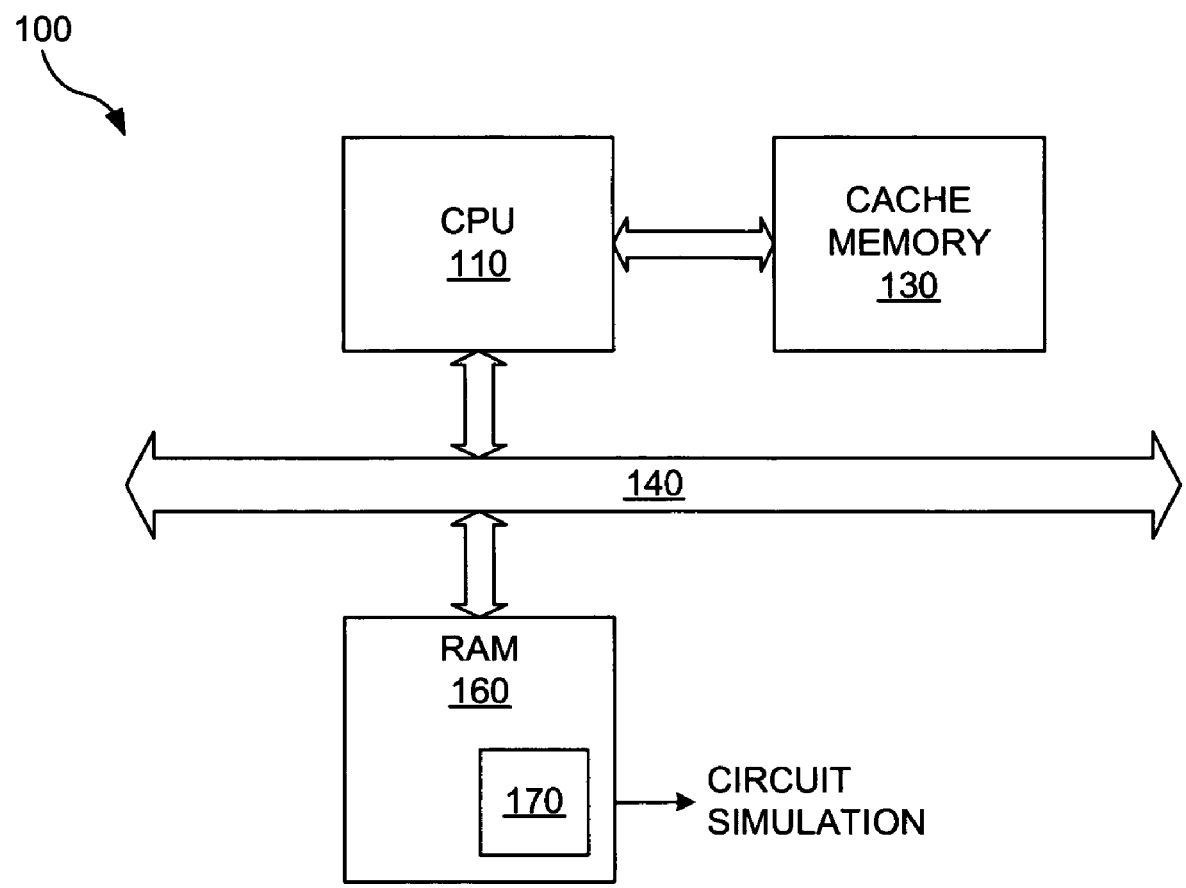
FIG. 1 schematically depicts a processing system in which circuit simulation can occur.

Turning now to FIG. 1, illustrated is a computing environment or system 100 in which signal transition calculations can operate. Generally, the system 100 calculates the time it takes for a signal transition after the original transition to propagate through the system, thereby leading to the ability for the software to calculate a variety of types of signal transitions.

In the system 100, the software is therefore set up so that either the leading or trailing edge of a transition can be caught. This can be useful because, for instance, the delay to the trailing edge of a clock waveform can determine whether the clock pulse is sufficiently wide to successfully function as the clock for a latch. Therefore, in order to calculate worst-case time, you may need something other than the first edge.

A processor 110 is coupled over a private bus to a cache memory 130. The processor 110 is also coupled over a second bus 140 to a RAM 160. The RAM 160 has entered into it measurements of behavior of a circuit 170 that is to be tested for non-leading edge transitions. The processor 110, using software, then calculates and captures the trailing edge or other edges of a circuit transition that is stored in the RAM 160.

In one embodiment, measurements of the non-leading edge transitions within the circuit 100 were added as two flags:

(-simPulseRF and -simPulseFR)

to a tlt::net_state0 Tcl interface command. Invocation of these commands can look like:

set clkRF [tlt::net_state0 -net_name clk -simPulseRF]

more generally, this command is:

set state_Tcl_variable [tlt::net_state0 -net_name name_of_net -simPulseRF]

-simPulseRF and -simPulseFR are both fixed values that are input to TLT that represent which transition one wishes to capture during the simulation.

These flags use the underlying capability of, for instance, an ACES, Adaptively Controlled Explicit Simulator, or SPICE simulator to choose the direction of transition that it captures through the ACES interface. In other words, it is determined for which transitions of a circuit the system 100 is going to test A static timing analysis program, such as EinsTimer's Timing for Transistor Level ("EinsTLT") extension exposes this capability of a circuit simulator to the EinsTLT timing model level. In the system 100, the output node initializations are updated to reflect that it could no longer be assumed that the initial logic state on a node was simply the opposite of the final logic state, since the opposite was true of the new states. In other words, in conventional technologies, the simulator would simply check to see when the first transition to the opposite state occurs, and capture this. The system 100, however, can capture transitions beyond the first transition to where the transition is on the same side again (for instance, falling ("F"), rising ("R"), F, and so on.

The system 100 can exploit the implementation of the ACES simulator to capture a number of more distant events. If, for example, a node in a circuit makes transitions R, F, R as a result of an input transition, one could choose to capture the second R rather than either of the first two transitions. There are at least two embodiments that could be used to do this.

In one embodiment, the possible series of pulses are extended by adding additional flags to the CI command interface layer and enums in the implementation to allow pulseRFR, pulseRFRF, and so on to be specified at the EinsTLT interface layer, thereby adding a new flag for each of the various signal transitions that can occur. The "pulse" in the signal flags' names is arbitrary, simply chosen to suggest that the circuit transitions which are being checked for include switching back and forth at least once between logic levels, and therefore include pulses between pairs of opposite transitions.

A second embodiment takes an integer argument for the number of the transition (substantially similar to the count within the ACES call) and enhances the data structures to retain it in the sensitization and pass it on to ACES.

Another embodiment of the system 100, which could require extending the ACES API, in the general case, would be to capture edges referenced from the last time that the node's waveform crosses a voltage threshold during the course of a simulation. For instance, given a node which might make a single R transition under some circumstances, and might make an R, F, R series of transitions under other circumstances, one might capture the last R transition time under both circumstances.

More generally, the last Nth transition could be captured. In other words, any transition could be selected in a way analogous to counting from the first transition, but in reverse. One circumstance where getting a last transition time would be useful lies in capturing the very worst case possible output slew from a circuit. Here, the delay from the very first rise through 10% of vdd to the very last rise through 90% of vdd captures a measure of worst case slew including all multiple switching events.

Figure 2:
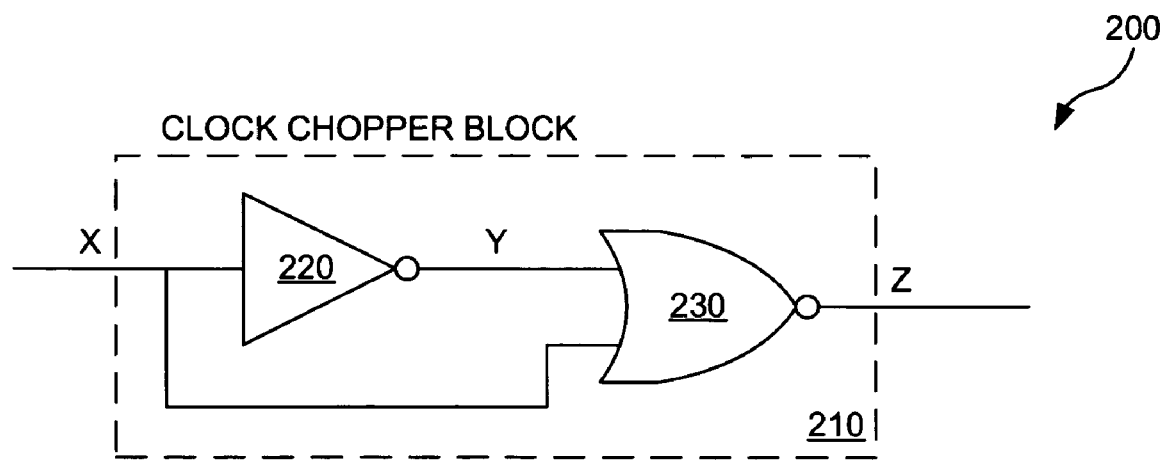
FIG. 2 illustrates a simulated clock chopper block.

FIG. 2 illustrates a simulated clock chopper block 200 that could be one embodiment of a circuit to be tested within the RAM 160 of a simulated clock chopper block 1. The simulated clock chopper block 200 illustrates a situation in which trailing and leading edges can occur on the output "Z". A signal X is applied to both an inverter 220 and a NOR gate 230. The output of the NOR 230 can first transition to an upper logic level, and subsequently transition to a lower logic level, depending upon how quickly the signal propagates.

Figure 3:
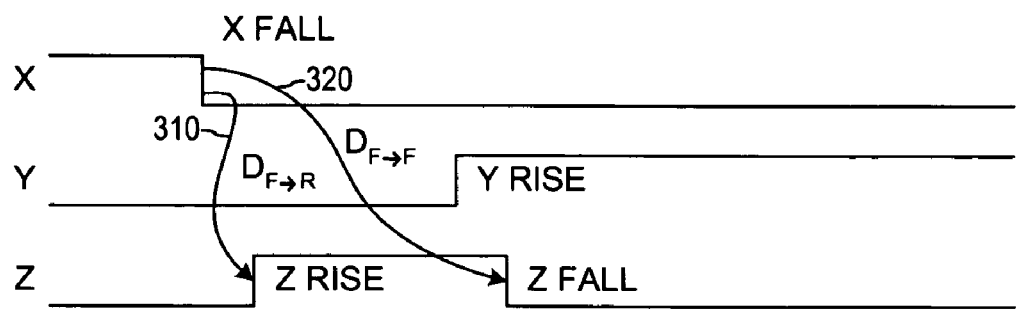
FIG. 3 illustrates a plurality of simulated signal transitions.

Turning now to FIG. 3, illustrated are stylized waveforms X, Y, and Z illustrating the operation of the clock chopper block shown in FIG. 2, and two transitions 310, 320 between events in the operation of the block. A falling edge on wire X directly causes a rising edge 310 on wire Z through the 2-input NOR 230. A falling edge on wire X also directly causes a rising edge on wire Y through the inverter 220, which then causes a falling edge 320 on wire Z. In the overall timing model of the clock chopper block 200, the X and Z wires are the boundaries of the design, so one way to represent the timing characteristics of the design is to represent the delays from input event(s) on wire X to output events on wire Z. In this example, these are the delays F->R 310 from X falling to Z rising and the delay F->F 320 from X falling to Z falling. The system 100 makes it possible to capture the F->F delay 320, even though it is the second transition on the Z wire in this chain of events. The software simulation can, in other words, capture both the first transition and subsequent transitions, and not just the first transition.

Figure 4:
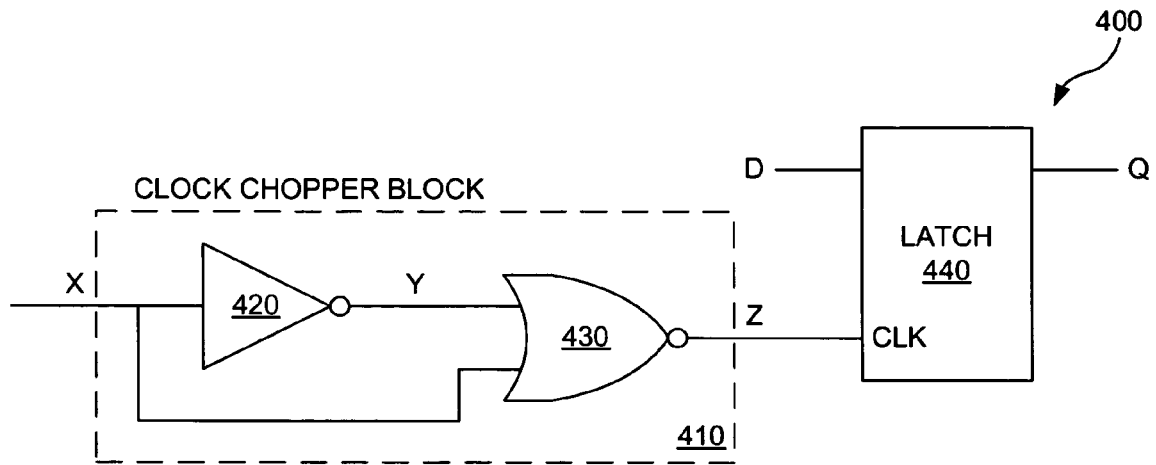
FIG. 4 illustrates a simulated clock chopper block coupled to a simulated latch.

Turning now to FIG. 4, illustrated is the clock chopper block circuit 410 in the context of a slightly larger design 400, showing the Z wire output of the clock chopper block driving the clock input pin of a latch. A signal X is applied to both an inverter 420 and a NOR gate 430. The output of the NOR 430 can first transition to an upper logic level and subsequently transition to a lower logic level, depending upon how quickly the signal propagates. The output of the chopper circuit 410 is then input as a clock signal to a latch 440, which determines the propagation of a signal from D to Q. Hence, checking for trailing pulses in timing sequences can be vital in computer systems.

Figure 5:
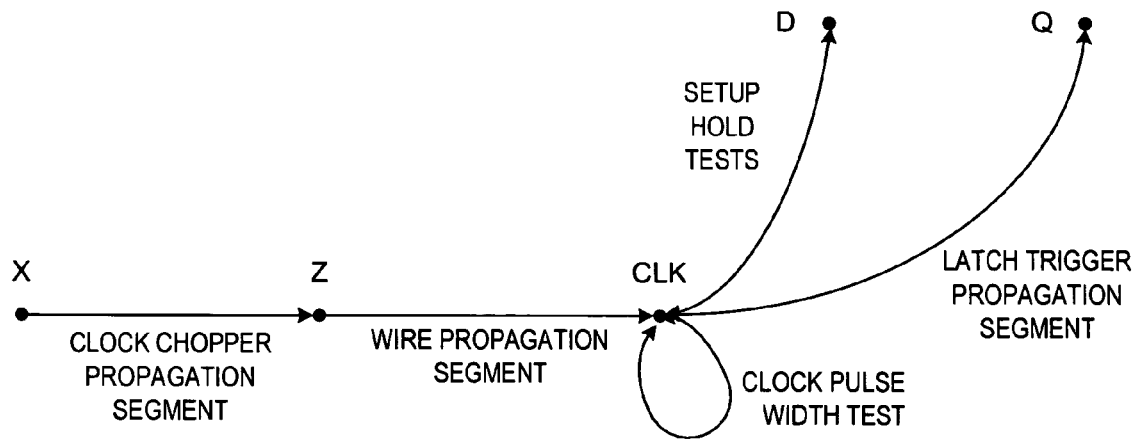
FIG. 5 illustrates a signal flow to a comparison test between a clock pin and itself to ensure that D input propagates to the Q output.

FIG. 5 shows a timing model of the slightly larger design of FIG. 4. It shows the timing model of the clock chopper block 420, a single propagation segment from X to Z. It shows the timing model of the latch 440, including a test segment between data pin D of the latch and the clock input pin, including setup and hold tests. The FIG. 5 also includes a clock trigger propagation segment from the clock input pin to the Q data output pin, and the latch clock pulse width test between the clock pin and itself.

One key point here is that the clock pulse width test provides a reason why it is necessary to know the delays to both the rising edge and the falling edge on the Z output pin of the clock chopper 410 (and therefore on the clock input pin of the latch 440). The clock pulse width test determines if the clock pulse arriving at the latch is wide enough for the latch to properly capture input data. If the pulse becomes too narrow, the latch cannot operate. The width of the pulse is the time between Z rising and Z falling. In order to compute this, we must know when Z falls. In order to compute when Z falls, we must know the delay DF->F from X falling to Z falling. In other words, if the pulse is too narrow, D will not propagate through the latch during the clock pulse, the old value of data stored in the latch will not have been replaced by the new value of data on pin D during the clock pulse, and an error condition can occur.

Figure 6:
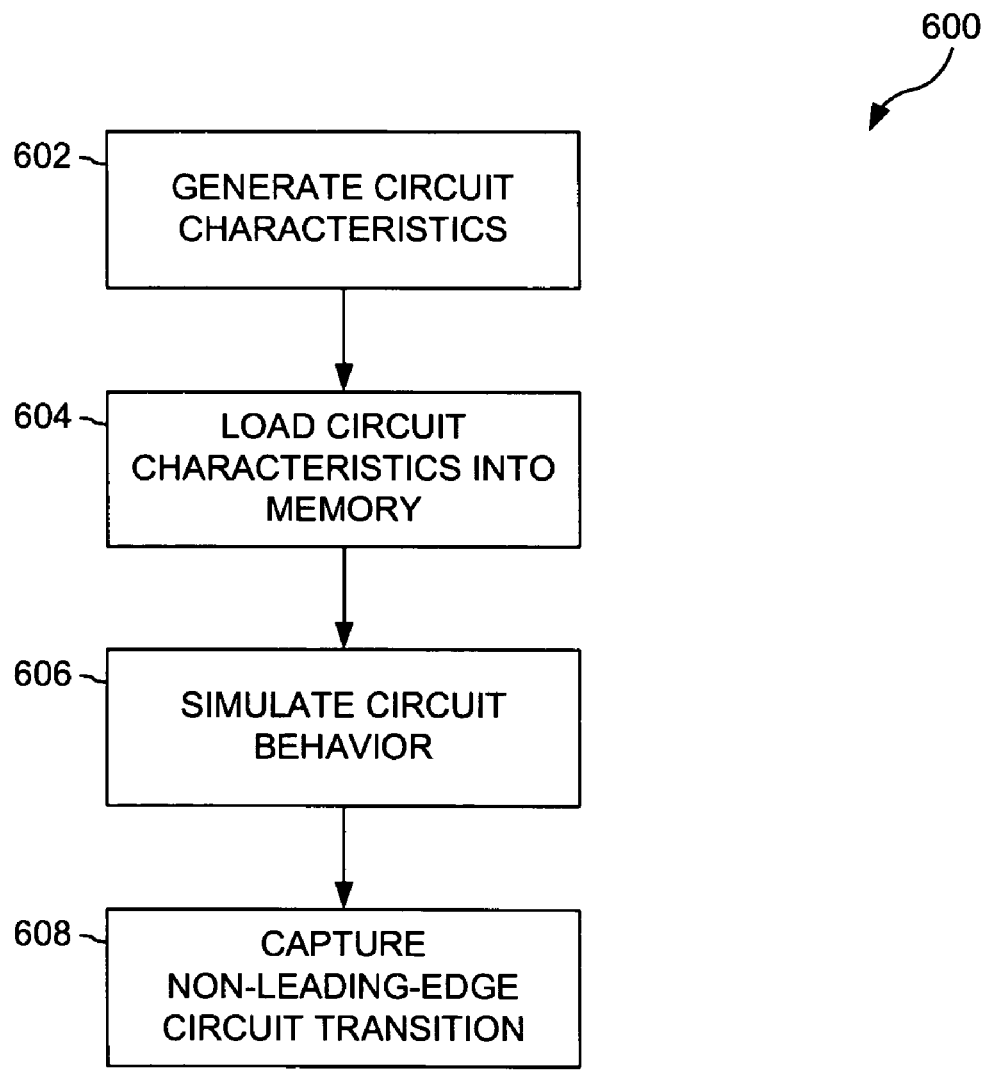
FIG. 6 is a flow chart illustrating a method of simulating signal transitions.

Turning now to FIG. 6, the reference numeral 600 generally indicates a flow chart illustrating a method of simulating signal transitions. In step 602, circuit characteristics are generated. In step, 604, circuit characteristics are loaded into memory. In step 606, circuit behavior is simulated. In step 608, a non-leading-edge circuit transition is captured.

It is understood that the present invention can take many forms and embodiments. Accordingly, several variations may be made in the foregoing without departing from the spirit or the scope of the invention. The capabilities outlined herein allow for the possibility of a variety of programming models. This disclosure should not be read as preferring any particular programming model, but is instead directed to the underlying mechanisms on which these programming models can be built.

Having thus described the present invention by reference to certain of its preferred embodiments, it is noted that the embodiments disclosed are illustrative rather than limiting in nature and that a wide range of variations, modifications, changes, and substitutions are contemplated in the foregoing disclosure and, in some instances, some features of the present invention may be employed without a corresponding use of the other features. Many such variations and modifications may be considered desirable by those skilled in the art based upon a review of the foregoing description of preferred embodiments. Accordingly, it is appropriate that the appended claims be construed broadly and in a manner consistent with the scope of the invention.

The invention claimed is:

1. A computer system for determining whether a pulse is wide enough to serve as a clock to a latch, the computer system comprising:
   a memory;
   a circuit simulated in the memory; and
   a processor coupled to the memory,
   wherein the circuit simulated in the memory comprises a clock chopper block and a latch, wherein the clock chopper block provides a clock input to the latch;
   wherein the clock chopper block comprises an inverter and a NOR gate, wherein the inverter receives a first signal as an input and provides a second signal as an output, wherein the NOR gate receives the first signal and second signal as inputs and provides a third signal as an output, and wherein the third signal is provided as the clock input to the latch;
   wherein a falling transition of the first signal causes a rising transition of the third signal after a first delay and wherein the falling transition of the first signal causes a rising transition of the second signal that causes a falling transition of the third signal after a second delay;
   wherein the processor is programmed to capture, responsive to the falling transition of the first signal, the rising transition of the third signal and the falling transition of the third signal;
   wherein the processor is programmed to determine the first delay and the second delay;
   wherein the processor is programmed to determine a pulse width of the third signal based on the first delay and the second delay; and
   wherein the processor is programmed to determine whether the pulse width of the third signal is wide enough to serve as the clock input to the latch.

2. The system of claim 1, wherein at least one captured transition is used in static timing analysis.

3. The system of claim 1, wherein the capture is performed with software.

4. The system of claim 1, wherein the circuit is simulated in the memory through the employment of SPICE.

5. The system of claim 1, wherein the circuit is simulated in the memory through the employment of ACES.

6. The system of claim 1, wherein software flags are used to denote which transition is to be captured.

7. A method of for determining whether a pulse is wide enough to serve as a clock to a latch, the method comprising:
   generating circuit characteristics for a circuit, wherein the circuit simulated in a memory of a computer system comprises a clock chopper block and a latch, wherein the clock chopper block provides a clock input to the latch, wherein the clock chopper block comprises an inverter and a NOR gate, wherein the inverter receives a first signal as an input and provides a second signal as an output, wherein the NOR gate receives the first signal and second signal as inputs and provides a third signal as an output, wherein the third signal is provided as the clock input to the latch, wherein a falling transition of the first signal causes a rising transition of the third signal after a first delay and wherein the falling transition of the first signal causes a rising transition of the second signal that causes a falling transition of the third signal after a second delay;
   loading circuit characteristics for the circuit into the memory of the computer system;
   simulating circuit behaviour for the circuit in the computer system;
   capturing, by the computer system, responsive to the falling transition of the first signal, the rising transition of the third signal and the falling transition of the third signal;
   determining, by the computer system, the first delay and the second delay;
   determining, by the computer system, a pulse width of the third signal based on the first delay and the second delay; and
   determining, by the computer system, whether the pulse width of the third signal is wide enough to serve as the clock input to the latch.

8. The method of claim 7, wherein at least one captured transition is used in static timing analysis.

9. The method of claim 7, wherein the capture is performed with software.

10. The method of claim 7, wherein the circuit is simulated through the employment of SPICE.

11. The method of claim 7, wherein the circuit is simulated through the employment of ACES.

12. The method of claim 7, wherein software flags are used to denote which transition is to be captured.

13. A computer program product for determining whether a pulse is wide enough to serve as a clock to a latch, the computer program product having a computer readable medium with a computer program embodied thereon, the computer program comprising:
   computer code for generating circuit characteristics for a circuit, wherein the circuit simulated in a memory of a computer system comprises a clock chopper block and a latch, wherein the clock chopper block provides a clock input to the latch, wherein the clock chopper block comprises an inverter and a NOR gate, wherein the inverter receives a first signal as an input and provides a second signal as an output, wherein the NOR gate receives the first signal and second signal as inputs and provides a third signal as an output, wherein the third signal is provided as the clock input to the latch, wherein a falling transition of the first signal causes a rising transition of the third signal after a first delay and wherein the falling transition of the first signal causes a rising transition of the second signal that causes a falling transition of the third signal after a second delay;
   computer code for loading circuit characteristics for the circuit into the memory of the computer system;
   computer code for simulating circuit behaviour for the circuit in the computer system;
   computer code for capturing, by the computer system, responsive to the falling transition of the first signal, the rising transition of the third signal and the falling transition of the third signal;
   computer code for determining, by the computer system, the first delay and the second delay;
   computer code for determining, by the computer system, a pulse width of the third signal based on the first delay and the second delay; and
   computer code for determining, by the computer system, whether the pulse width of the third signal is wide enough to serve as the clock input to the latch.

14. The computer program product of claim 13, wherein at least one captured transition is used in static timing analysis.

15. The computer program product of claim 13, wherein the capture is performed with software.

16. The computer program product of claim 13, wherein the circuit is simulated through the employment of SPICE.

17. The computer program product of claim 13, wherein the circuit is simulated through the employment of ACES.

18. The computer program product of claim 13, wherein software flags are used to denote which transition is to be captured.

* * * * *